(12) United States Patent
Payne et al.

(10) Patent No.: US 6,811,040 B2
(45) Date of Patent: Nov. 2, 2004

(54) WAFER HOLDING APPARATUS

(75) Inventors: Thomas Payne, Charlton, MA (US);
Jitendra S. Goela, Andover, MA (US);
Lee E. Burns, Winchester, MA (US);
Michael A. Pickering, Dracut, MA (US)

(73) Assignee: Rohm and Haas Company,
Philadelphia, PA (US)

( * ) Notice: Subject to any disclaimer, the term of this patent is extended or adjusted under 35 U.S.C. 154(b) by 0 days.

(21) Appl. No.: 10/191,192

(22) Filed: Jul. 9, 2002

(65) Prior Publication Data

US 2003/0024888 A1 Feb. 6, 2003

Related U.S. Application Data

(60) Provisional application No. 60/305,764, filed on Jul. 16, 2001.

(51) Int. Cl.[7] .............................................. A47G 19/08
(52) U.S. Cl. ...................... 211/41.18; 211/183; 206/832
(58) Field of Search ................................ 211/183, 41.1, 211/41.18; 118/500, 728; 403/381; 432/258, 253, 257; 206/454, 832; 414/935, 941

(56) References Cited

U.S. PATENT DOCUMENTS

| | | | | |
|---|---|---|---|---|
| 2,544,053 A | * | 3/1951 | Sharaf ....................... 211/41.2 |
| 4,019,298 A | * | 4/1977 | Johnson, IV ............... 52/590.1 |
| 4,823,736 A | * | 4/1989 | Post et al. .................. 118/730 |
| 4,978,567 A | | 12/1990 | Miller |
| 4,987,016 A | | 1/1991 | Ohto et al. |
| 5,114,265 A | * | 5/1992 | Grisley ....................... 403/381 |
| 5,203,595 A | * | 4/1993 | Borzone et al. ............ 285/325 |
| 5,316,472 A | * | 5/1994 | Niino et al. ................ 432/241 |
| 5,333,964 A | * | 8/1994 | Thomas ...................... 403/339 |
| 5,354,580 A | | 10/1994 | Goela et al. |
| 5,358,124 A | * | 10/1994 | Mueller ..................... 211/41.12 |
| 5,358,685 A | * | 10/1994 | Ezis ............................. 419/19 |
| 5,447,683 A | * | 9/1995 | Montgomery et al. ...... 420/117 |
| 5,514,439 A | | 5/1996 | Sibley |
| 5,538,230 A | | 7/1996 | Sibley |
| 5,588,726 A | * | 12/1996 | Lee ............................. 312/263 |
| 5,591,287 A | * | 1/1997 | Clegg et al. ............. 156/89.27 |
| 5,638,028 A | | 6/1997 | Goela et al. |
| 5,858,103 A | * | 1/1999 | Nakajima et al. ........... 118/728 |
| 5,893,617 A | * | 4/1999 | Lee ............................. 312/263 |
| 5,984,115 A | * | 11/1999 | Koestenblatt et al. ......... 211/40 |
| 6,027,089 A | * | 2/2000 | Maharg et al. ......... 248/220.21 |
| 6,056,123 A | * | 5/2000 | Niemirowski et al. ...... 206/711 |
| 6,065,615 A | * | 5/2000 | Uchiyama et al. ........ 211/41.18 |
| 6,099,645 A | * | 8/2000 | Easley et al. ............... 118/500 |
| 6,225,594 B1 | * | 5/2001 | Zehavi ................... 219/121.64 |
| 6,228,297 B1 | * | 5/2001 | Goela et al. .................. 264/81 |

(List continued on next page.)

FOREIGN PATENT DOCUMENTS

| | | | |
|---|---|---|---|
| JP | 9-293685 | * | 9/1997 |
| JP | 10-273399 | * | 9/1997 |
| JP | 10-45485 | | 2/1998 |
| JP | 2000-49208 | | 2/2000 |
| JP | 2000-164522 | | 6/2000 |

Primary Examiner—Carl D. Friedman
Assistant Examiner—Jennifer E. Novosad
(74) Attorney, Agent, or Firm—John J. Piskorski (57) ABSTRACT

A wafer holding apparatus composed of a plurality of rods joined at opposite ends by endplates. Each rod at each end is secured to the endplates by a mechanical dovetail joint. The dovetail joint secures the rods to the endplates without the need for sealing or coating agents. Also, auxiliary mechanical components such as nuts and bolts to secure the joint components need not be employed to secure the joint. Each rod has multiple grooves or slits for placing multiple semiconductor wafers that are to be processed in processing chambers. The wafer holding apparatus is oxidation resistant, chemical resistant and thermal shock resistant.

14 Claims, 6 Drawing Sheets

U.S. PATENT DOCUMENTS

| | | | |
|---|---|---|---|
| 6,276,592 B1 * | 8/2001 | Jochmann et al. | 228/121 |
| 6,378,538 B1 * | 4/2002 | Brandenburg et al. | 134/201 |
| 6,435,758 B1 * | 8/2002 | Hinkel | 403/283 |
| 6,450,346 B1 * | 9/2002 | Boyle et al. | 211/41.18 |
| 6,488,497 B1 * | 12/2002 | Buckley et al. | 432/258 |
| 6,523,701 B1 * | 2/2003 | Yoshida et al. | 211/41.18 |
| 6,536,608 B2 * | 3/2003 | Buckley | 211/41.18 |
| 6,573,198 B2 * | 6/2003 | Boonstra et al. | 211/41.18 |
| 2002/0092815 A1 * | 7/2002 | Kim et al. | 211/41.18 |
| 2002/0113027 A1 * | 8/2002 | Minami et al. | 211/41.18 |
| 2002/0130061 A1 * | 9/2002 | Hengst | 206/710 |
| 2003/0059568 A1 * | 3/2003 | Pickering et al. | 428/66.6 |

\* cited by examiner

WAFER HOLDING APPARATUS

The present application is a non-provisional application of provisional application No. 60/305,764, filed Jul. 16, 2001.

BACKGROUND OF THE INVENTION

The present invention is directed to an apparatus for holding semiconductor wafers, the component parts of which are held together by a mechanical joint. More specifically, the present invention is directed to an apparatus for holding semiconductor wafers, the component parts of which are held together by a mechanical joint that can withstand the harsh conditions of devices used in coating semiconductor wafers.

Processing of semiconductor wafers involves harsh conditions such as exposure to corrosive conditions, high temperatures and rapid thermal cycling. Accordingly, wafer support fixtures, also known as furniture or wafer boats, need to withstand such harsh conditions. One method for processing semiconductor wafers involves rapid thermal processing (RTP). Such processes are performed in rapid thermal annealing apparatus (RTA). Semiconductor wafers are treated in an RTA from room temperature to temperatures of about 400° C. to about 1400° C. in periods of time on the order of a few seconds. The ability of such RTA systems to rapidly heat and cool a wafer from room temperature to such high temperatures in period of up to 10 seconds make them attractive for use in chemical reaction processes such as epitaxial film, amorphous silicon or polycrystalline silicon deposition.

The semiconductor industry has recognized that silicon carbide can withstand the harsh conditions involved in semiconductor processing and is a superior material for construction of wafer fixtures such as boats. Prior to silicon carbide, quartz was used as a material for wafer fixtures. However, quartz was an inadequate material for wafer fixtures because of the harsh process reaction environment as in RTP systems and the thermal incompatibility with materials used in wafer manufacture.

U.S. Pat. No. 4,978,567 to Miller discloses a silicon carbide wafer fixture employed in an RTP system. The fixture of the Miller patent consists of silicon carbide and is fabricated by chemical vapor deposition of the silicon carbide on a graphite substrate followed by destructive oxidation to remove the graphite. The Miller fixture is a single piece of silicon carbide, including a wafer support surface formed integrally with an annular surface surrounding the wafer support, and further including an annular sidewall for holding the wafer support surface at the proper height.

In the Miller fabrication method, the graphite interfaces with deposited silicon carbide is always formed on the backside of the wafer support section, opposite the support face designed for contact with the semiconductor wafer. As a result, there is no convenient technique for providing such a wafer support face with a precisely planar finish. Also, the Miller process does not allow the mold to be used for providing precisely detailed structural features in the support face.

U.S. Pat. No. 5,538,230 to Sibley discloses a single piece silicon carbide wafer boat that may hold multiple wafers for bulk processing. The wafer boat is a generally cylindrical shell section with an average inner radius slightly greater than the radius of wafers that are to be held in the boat. The generally concave inner surface of the boat includes at least two longitudinally uniform convex portions wherein a plurality of orthogonal slots or grooves are located to provide wafer support. Since the carrier is used in a horizontal position, each of the wafers is thereby supported in a vertical position, parallel to each other. The boat walls have a substantially uniform thickness except for the areas where the wafer slots are located.

The boat is made by chemically vapor depositing (CVD) silicon carbide on a graphite mold. The resulting silicon carbide shell is separated from the graphite mold by destructively burning away the mold whereby only the deposited shell remains. The orthogonal slots or grooves are machined into the shell to provide the wafer support points. Other features of the boat, such as length, height and width of the bottom and base widths may be shaped by grinding. Although post-deposition machining of a monolithic CVD-silicon carbide sheet or block may be used to form the desired object, such machining is difficult. Silicon carbide, especially theoretically dense (entirely non-porous) CVD silicon carbide, is very hard and renders machining difficult and costly. Thus, a silicon carbide boat that may be employed for bulk processing of wafers with a minimal amount of machining is highly desirable.

Fabricating semiconductor furniture from a plurality of CVD silicon carbide parts also presents a number of difficulties. Specialized applications to which CVD silicon carbide articles are often employed require that any bonds between the parts withstand extremes, such as temperature extremes. Thus, in fabricating semiconductor furniture from a plurality of CVD silicon carbide parts substantially all organic-based adhesives are entirely unsuitable because they decompose far below the semiconductor processing temperatures.

Several techniques have been proposed to bond silicon carbide parts or components. These include direct bonding (T. J. Moore, "Feasibility Study of the Welding of SiC", *J Amer. Ceram. Soc.*, 68, C151–153 (1985).), codensification of interlayers and green bodies (C.H. Bates, et al. "Joining of Non-Oxide Ceramics for High-Temperature Applications," *Amer. Ceram. Soc. Bull.*, 69, 350–356 (1990)), hot pressing of suitable silicon carbide powders (T. Iseki, K. Arakawa and H. Suzuki, "Joining of Dense Silicon Carbide by Hot Pressing," *J. Mater. Sci. Letters*, 15, 1049–1050 (1980)), bonding with polymeric precursors (S. Yajima, et al., "Joining of Silicon Carbide to Silicon Carbide Using Polyborosiloxane," *Amer. Ceram. Soci. Bull.*, 60, 253 (1981)), brazing (J. A. P. Gehris, "High Temperature Bonding of Silicon Carbide," M.S. Thesis, New Mexico Institute of Mining and Technology, Socorro, N. Mex. (1989)), reactive metal bonding (S. Morozumi, ete al., "Bonding Mechanism Between Silicon Carbide and Thin Foiuls of Reactive Metals," *J. of Mater. Sci.* 20, 2976–3982 (1985)), "pressurized combustion reaction", reaction with and without the use of tape (H. B. Rabin, "Joining of SiC/SiC Composites and Dense SiC Using Combustion Reaction in the Ti—C—Ni System," *J. Amer. Ceram. Soc.*, 75, 131–135 (1992)), and microwave joining (I. Ahmed and R. Silberglitt, "Joining Ceramics Using Microwave Energy," *Mat. Res. Soc. Symp. Proc.*, 314, 119–130 (1993)). These techniques have limited utility for semiconductor applications due to one or more drawbacks, such as use of filler material which can contaminate the furnace environment, inability of joints to withstand high service temperatures, and the need for very high temperatures or pressures during joining processing. Furthermore, most of these do not concentrate on male/female joints, where, for example, a rod is inserted into a hole and then bonding is performed. Such male/female joints are particularly desirable for fabricating wafer carriers and other furnace components for the semiconductor industry.

A male/female joint broadly defined is a joint in which an inserted (male) member is received within and bonded to a receiving (female) member. An example of a male/female joint is a joint in which the sidewalls of the male and female members are substantially parallel to each other. Such a male/female joint may be a rod inserted, for example, in a receiving closed-end bore or a sheet having parallel sides inserted in a receiving slot or groove. In bonding such a joint, it is desirable that bonding be effected between the sidewalls to provide good stability to the manufactured article. Unlike a butt joint, it is difficult to provide adequate pressure along the sidewalls of the male and female members to secure the male and female members together.

U.S. Pat. No. 5,683,028 to Goela et al. discloses a chemical means of securing a male/female joint in a silicon carbide boat. The boat in composed of four monolithic silicon carbide rods with a plurality of slits or grooves to retain multiple semiconductor wafers for processing. Each rod has two male joint members that slide into a corresponding female port in an endplate to form a single article. The joint is secured with a silicon sealant that provides sufficient pressure along all points or the male/female joint. Optionally, the joint may be further secured with a coating of CVD silicon carbide. Such a joint can withstand the harsh conditions involved in wafer processing and the silicon sealant does not contaminate the environment of the processing apparatus.

Japanese patent publications 2000164522A and Hei 10-45485 disclose a wafer fixture or boat for semiconductor manufacture composed of components coated with silicon carbide and a method of coating. The wafer fixture is composed of rods having a plurality of grooves or slits for holding multiple wafers for processing. The rods have "T" shaped catch parts at each end and are secured to endplates having mounting holes by a work body or nut. The rods and endplates of the fixture are not composed of monolithic silicon carbide. The components of the fixture are composed of a silicon matrix with particles of silicon carbide with a thin carbon layer and further coated with a CVD silicon carbide film as described in Hei 10-45485. Such a composition allegedly raises peel resistance of the thin silicon carbide film thus improving oxidation resistance, chemical resistance and thermal shock resistance of the fixture. However, workers in the art know that such thin film silicon carbide coatings often crack or chip when employed in the harsh wafer processing environments. Thus, a wafer fixture composed entirely of CVD silicon carbide is preferred.

Although there are semiconductor wafer fixtures composed of CVD silicon carbide components and that are secured by means that can withstand the harsh conditions of semiconductor wafer processing apparatus, there is still a need for improved CVD silicon carbide wafer fixtures.

SUMMARY OF THE INVENTION

The present invention is directed to an apparatus composed of a plurality of silicon carbide rods secured at opposite ends to endplates by a dovetail joint means. Each rod of the apparatus has a dovetail key component that corresponds to a dovetail lock component on an endplate. When the apparatus is assembled, the dovetail joint means secures the rods to the endplates mechanically such that no sealant is required to hold the components of the apparatus together. Each rod has a plurality of grooves for placing semiconductor wafers in the apparatus. The entire apparatus may be placed in suitable chambers for processing the semiconductor wafers.

Advantageously, the dovetail joint provides a sufficiently secure apparatus such that chemical sealing agents within the joint or coating the joint with a chemical sealant may be avoided. Many such sealing agents and chemical coatings may contaminate the apparatus or furnace used to process semiconductor wafers resulting in defective wafers. Additionally, elimination of such sealing agents enables easy and rapid assembly of the apparatus.

Another advantage of the dovetail joint of the present invention is that the dovetail joint need not employ additional fasteners and mounting means such as bolts, clamps or nuts to secure the components of the dovetail joint. Thus, the apparatus has a minimal number of separate parts to function effectively as a wafer boat. A minimal number of separate parts is highly desirable for apparatus used to hold semiconductor wafers. During wafer processing methods, the wafers as well as the apparatus holding the wafers become coated with chemical materials such as silicon or silicon carbide. Such materials are difficult to remove from the holding apparatus during cleaning. When an apparatus such as a wafer boat is composed of numerous parts, especially small fasteners such as bolts, nuts or clamps, cleaning is more difficult and time consuming. Thus, a holding apparatus with a minimal number of separate parts is highly desirable.

The rods and endplates of the apparatus are composed of monolithic silicon carbide. Thus, each component part is a solid material without thin film coatings. Thus, there is no concern for peeling of layers from the rods and endplates of the apparatus. Because the component parts are composed of monolithic silicon carbide, the apparatus is oxidation resistant, chemical resistant and thermal shock resistant. Accordingly, the apparatus may be employed in chambers, such as a RTA, where harsh chemical compounds are employed as well as high temperatures and rapid temperature changes.

A primary objective of the present invention is to provide a semiconductor wafer holding apparatus that is secured by a dovetail joint.

Another objective of the present invention is to provide a semiconductor wafer holding apparatus that can withstand the harsh conditions of chambers used to process semiconductor wafers.

An additional objective is to provide a semiconductor wafer holding apparatus where sealing agents and chemical coating need not be employed to secure the joints of the apparatus.

A further objective of the present invention is to provide a semiconductor wafer holding apparatus that is oxidation resistant, chemically resistant and thermal shock resistant.

After reading the following detailed description of the invention and the appended claims, additional objectives and advantages of the present invention may be ascertained by a person of skill in the art.

DETAILED DESCRIPTION OF THE INVENTION

The present invention is directed to an apparatus for holding multiple semiconductor wafers that is composed of a plurality of silicon carbide rods secured to silicon carbide endplates at opposite ends of the plurality of rods by dovetail joints or D-shaped joints or C-shaped joints. Each rod of the apparatus has a plurality of slots or grooves for retaining semiconductor wafers. Apparatus for holding semiconductor wafers are also known as wafer fixtures or wafer boats. Wafer boats of the present invention retain multiple semiconductor wafers for processing of the wafers in chambers where harsh chemicals and high temperatures are employed. Advantageously, the mechanical dovetail joint secures the rods to the endplates of the apparatus such that sealing agents in the dovetail joint or chemical coatings over the dovetail joint may be avoided. Additionally, the apparatus is oxidation resistant, chemical resistant and thermal shock resistant. Because the component parts of the apparatus are composed of solid silicon carbide, there is no problem of material peeling from the surface of the rods or endplates when the apparatus is employed in semiconductor processing chambers.

Figure 1:
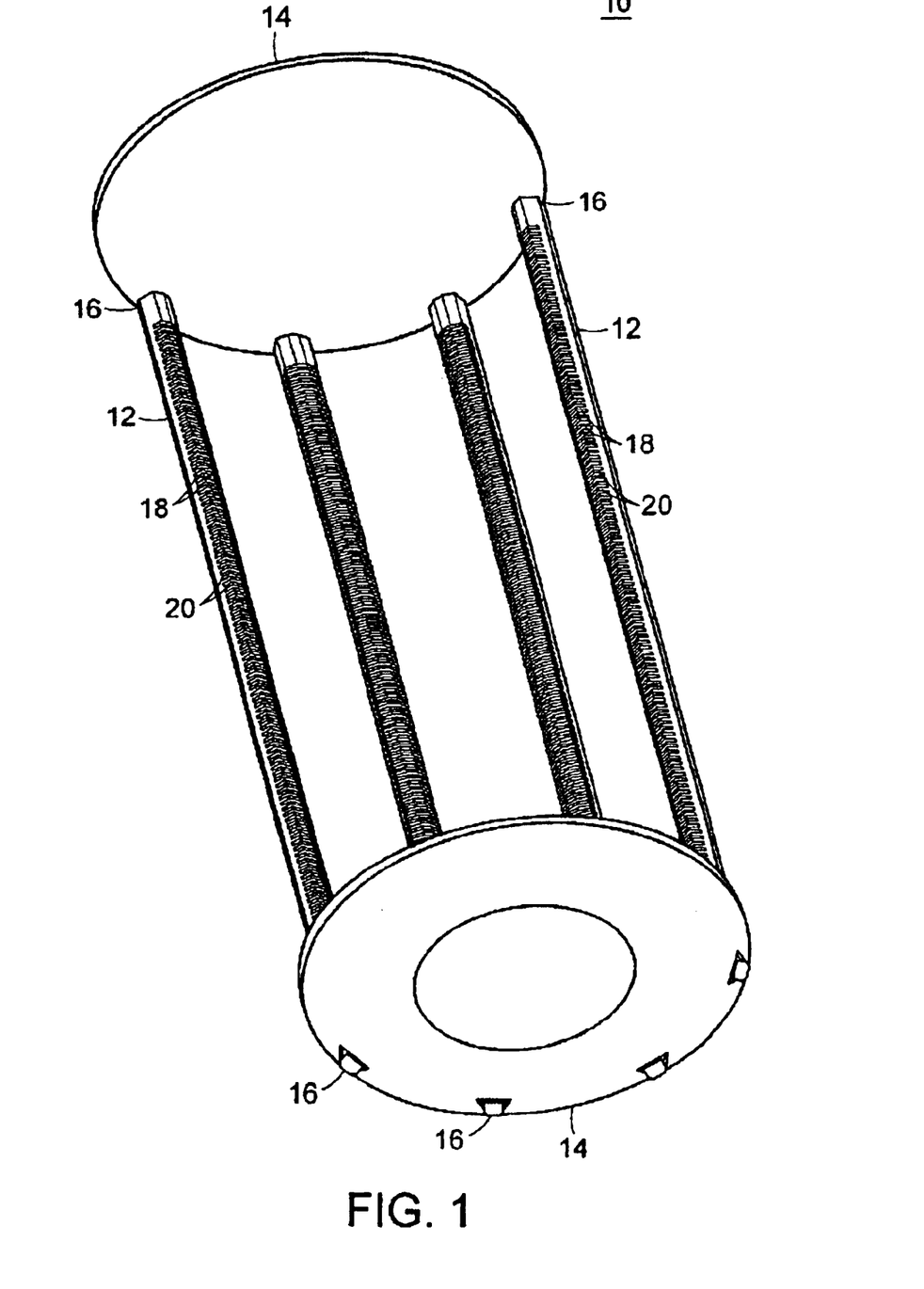
FIG. 1 is a perspective view of a wafer holding apparatus formed of component parts secured with dovetail joints.
Figure 2A:
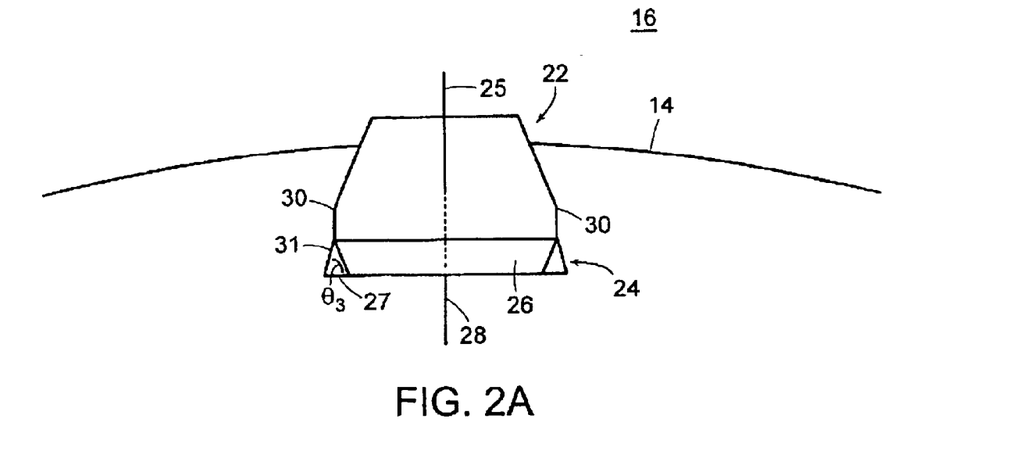
FIG. 2A is a frontal elevation view of a mechanical dovetail joint that secures component parts of a wafer holding apparatus.

FIG. 1 illustrates one embodiment of the wafer holding apparatus or wafer boat of the present invention. Wafer boat 10 is composed of a plurality of rods 12 secured to endplates 14 by dovetail joints or D-shaped joints 16. The dovetail joint 16 is composed of a dovetail or D-shaped key (male component) 22 and a dovetail or D-shaped lock (female component) 24 as illustrated in FIGS. 2A, 3A, 3B and 4. Dovetail face 26 of dovetail key 22 forms a 90° angle $\theta_1$ with surface 28 of rod 12. Sides 30 of dovetail key 22 form an angle with surface 28 of from about 1° to about 45°, preferably from about 5° to about 30°, and most preferably from about 10° to about 20° as indicated by $\theta_2$. As illustrated in FIG. 2A angle $\theta_3$ between side 27 and side 31 of dovetail lock 24 is from about 25° to about 50°, preferably from about 30° to about 45°. While the illustrations show the endplates as an ellipse, the endplates may have any suitable shape for joining to the rods. Other suitable shapes include, but are not limited to, rectangular, triangular, rhomboid, and the like.

Dovetail joint 16 is formed between dovetail key 22 and dovetail lock 24 by contacting sideways the narrow portion of dovetail key 22 with the dovetail lock 24 at the opening on endplate 14 followed by a clockwise or counter clockwise twisting motion. Dovetail key 22 slides into dovetail lock 24 to form the secure dovetail joint 16. To separate the components of dovetail joint 16, dovetail key 22 is turned clockwise or counter clockwise in dovetail lock 24 with an outward applied force. Dovetail joint 16 is a secure joint, and provides a secure and stable wafer boat 10 that can be employed in the harsh conditions of wafer processing chambers. When the apparatus is assembled, axis 25 of dovetail key 22 is perpendicular to axis 28 of dovetail lock 24 as illustrated in FIG. 2A.

Each rod 12 has a plurality of grooves or slots 18 and teeth 20 to retain multiple semiconductor wafers (not illustrated) such that multiple wafers may be processed simultaneously in a processing apparatus such as a RTA. The number of rods may vary. For example, a wafer holding apparatus may have from 2 to 6 rods, preferably from 3 to 4 rods. While the specific shape of the rod may vary, the rods illustrated in FIGS. 3A, 3B, 3C, 5A and 5B have a back flange continuous with dovetail key 22 and a front flange 34 which is continuous with surface 28 and terminates with the start of grooves 18 and teeth 20. When the rods 12 are assembled with endplates 14 to form the apparatus as shown in FIG. 1, the endplates 14 rest on surface 28.

Figure 2B:
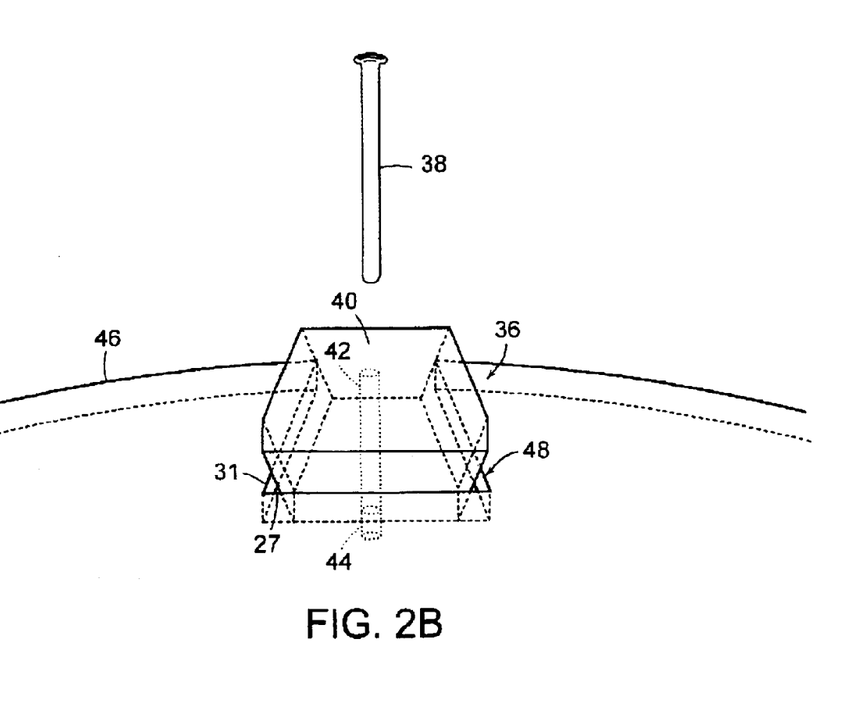
FIG. 2B is a frontal elevation view of a mechanical dovetail joint and pin that secures component parts of a wafer holding apparatus.
Figure 3A:
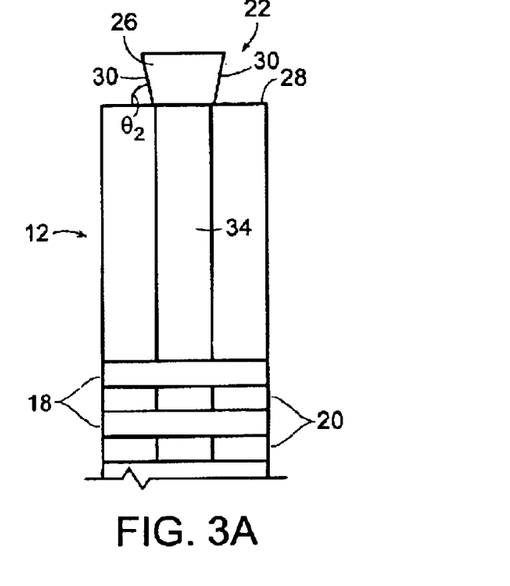
FIG. 3A is a front view of an end portion of a rod component of a wafer holding apparatus with a dovetail key component.
Figure 3B:
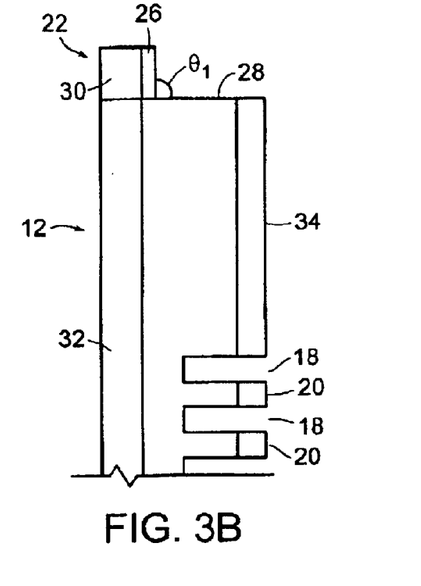
FIG. 3B is a side view of an end portion of a rod component of a wafer holding apparatus with a dovetail key component.
Figure 3C:
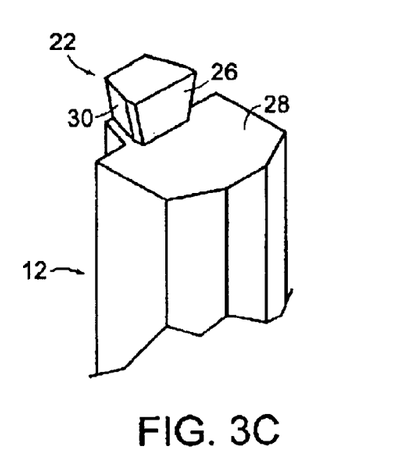
FIG. 3C is a view of an end portion of a rod component of a wafer holding apparatus showing the dovetail key and the surface of the rod.
Figure 4:
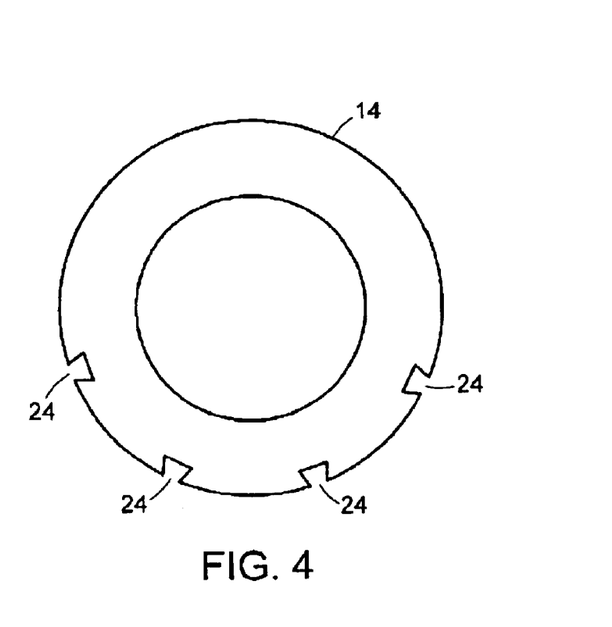
FIG. 4 is a face view of an endplate component of a wafer holding apparatus with dovetail lock components.
Figure 5A:
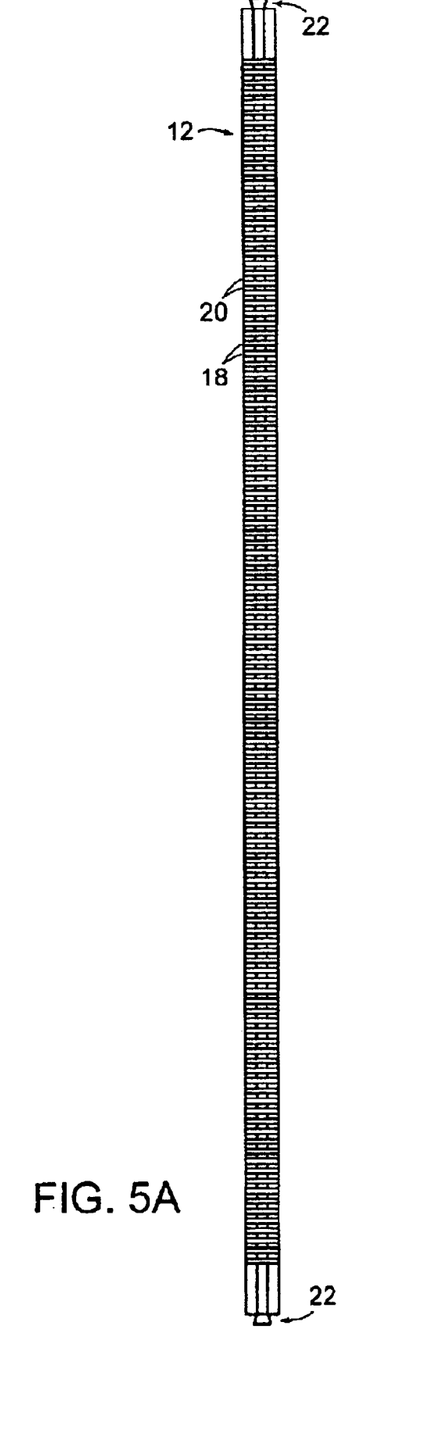
FIG. 5A is a front view of a rod component of a wafer holding apparatus with teeth and grooves.
Figure 5B:
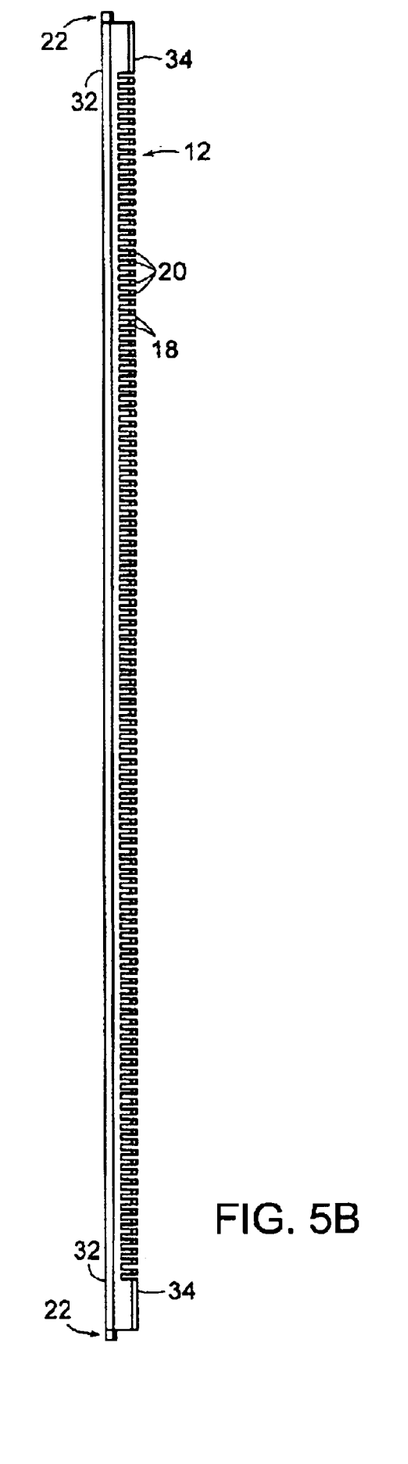
FIG. 5B is a side view of a rod component of a wafer holding apparatus with teeth and grooves.

In an alternative embodiment of the present invention as illustrated in FIG. 2B, dovetail joint 36 is further secured with pin 38. Dovetail key 40 has a bore 42 that meets bore 44 within endplate 46. Bore 44 opens into dovetail lock 48 to meet bore 42.

Figures 6A, 6C:
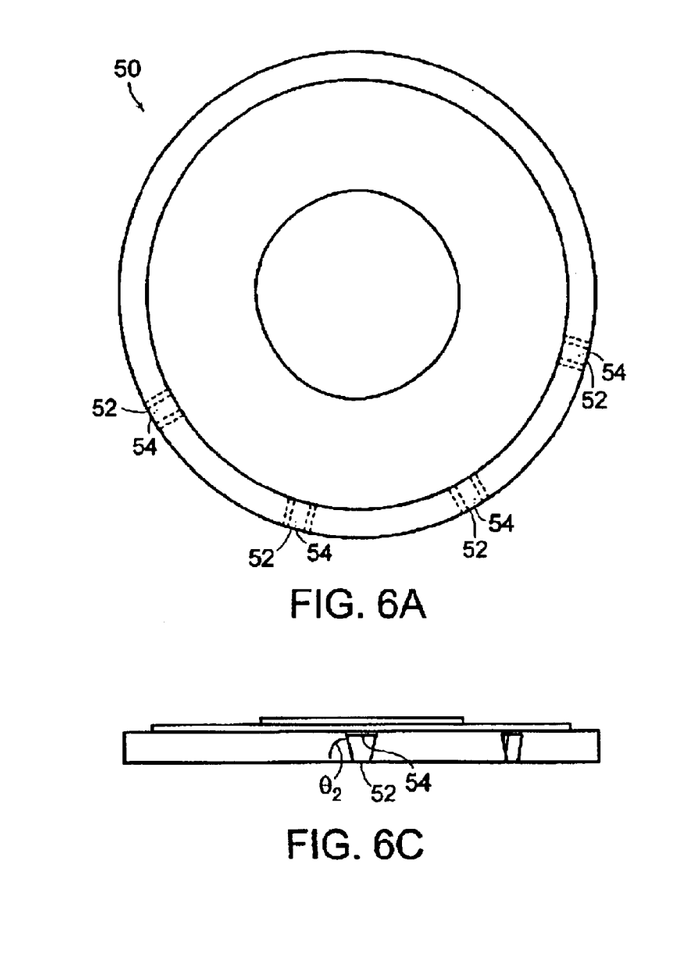
FIG. 6A is a top view of an endplate with blind locks.
FIG. 6C is a cross-section of an endplate with blind locks.
Figure 6B:
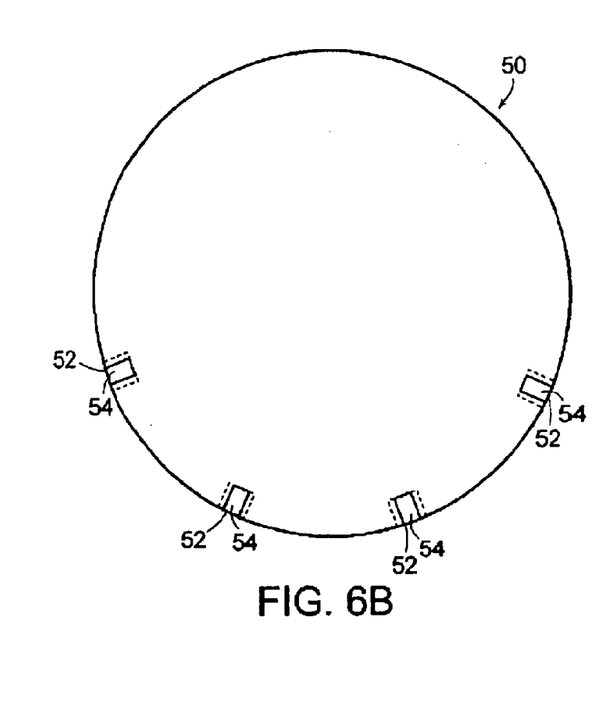
FIG. 6B is a bottom view of an endplate with blind locks.
Figure 7A:
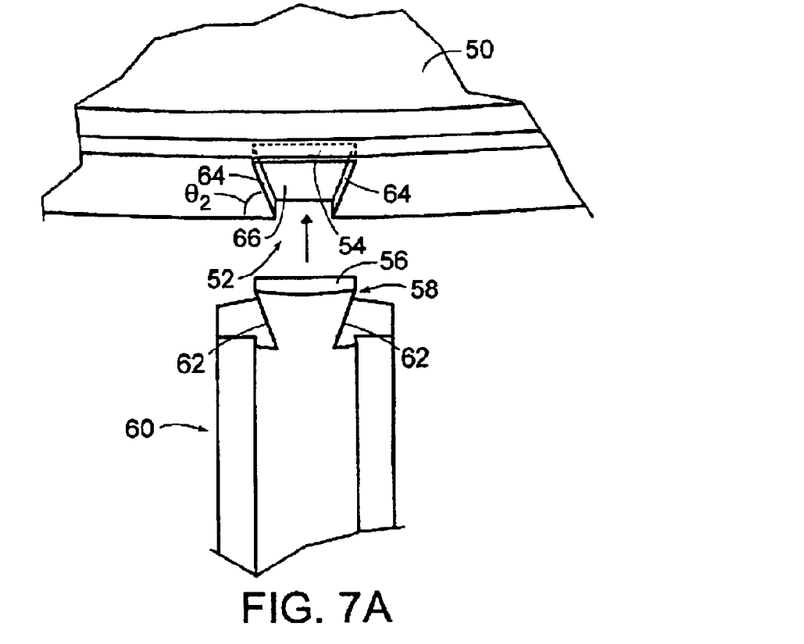
FIG. 7A is an illustration of a dovetail key inserted sideways into a blind lock endplate.

The endplates of the wafer holding apparatus of the present invention may also have a blind lock where the lock has an opening or orifice on one face of the endplate. When the endplate has a blind lock, the dovetail key is connected to the endplate sideways and snaps into place where the dovetail key is retained in place by tension between the top and sides of the dovetail key and the top and sides of the dovetail lock. The top and sides of the dovetail key and the dovetail lock are parallel to each other. Such joints are often referred to as C-Shaped joints. FIG. 6A shows the top face of endplate 50 with blind locks 52. FIG. 6B shows the bottom face of endplate 50 with blind locks 52 with top surfaces 54 that meet with the top surfaces 56 of corresponding dovetail keys. FIG. 7A shows dovetail key 58 of rod 60 being inserted into dovetail lock 52 where dovetail key 58 is retained by contact between dovetail key sides 62 and dovetail key sides 64. The dovetail key 58 is also retained by contact between the tops of dovetail key 56 and dovetail lock 54 and dovetail lock face 66 and the dovetail key face (not shown). Angle $\theta_2$ also provides sufficient tension between the lock and the key to help sustain the joint.

Figure 7B:
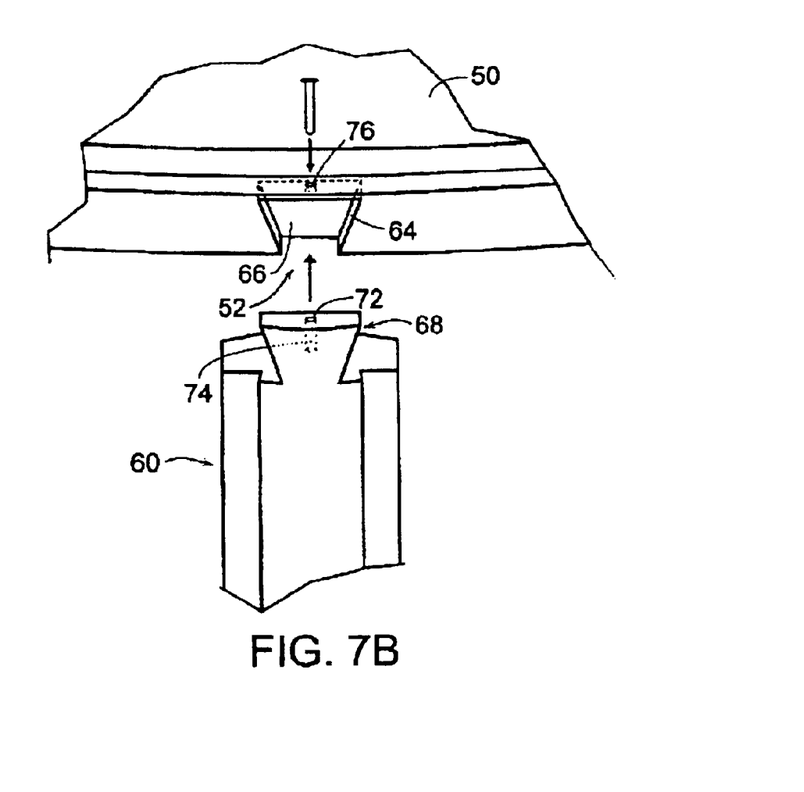
FIG. 7B is an illustration of a dovetail key with a bore being inserted sideways into a blind lock endplate and further secured with a pin.

In an additional embodiment of the present invention as shown in FIG. 7B, dovetail key 68 may be further secured to endplate 50 with pin 70. Dovetail key 68 contains hole 72 for receiving pin 70 into bore 74. Pin 70 passes into bore 76 in dovetail lock top 54 to insert into bore 74.

In another alternative embodiment of the present invention, the dovetail joints may optionally be coated with a layer of CVD silicon carbide for additional securing of the dovetail joints. The CVD silicon carbide coating or cladding seals the entire joint. Any suitable method for depositing CVD silicon carbide may be employed to form the cladding. U.S. Pat. No. 5,354,580 to Goela et al. discloses a method and apparatus for forming CVD silicon carbide that may be employed to practice the present invention, the entire disclosure of which is hereby incorporated herein by reference.

The component parts of the wafer holding apparatus of the present invention are composed of monolithic silicon carbide, preferably CVD silicon carbide. Any suitable method for forming CVD silicon carbide components may be employed to make the component parts of the present invention. U.S. Pat. No. 5,354,580 to Goela et al. cited above discloses a method and apparatus that may be employed to make CVD silicon parts for the present invention. After the component parts have been prepared by CVD or any other suitable process, the component parts are machined to their desired shape and dimensions. Machining methods for silicon carbide articles are well known in the art. Machining is often performed using diamond materials. Dimensions for the component parts of the wafer holding apparatus may vary. The dimensions of the component parts of the wafer holding apparatus are limited only by the ability of technology to machine silicon carbide. For example, a dovetail key may have a top width of from about 4.0 mm to about 15 mm, preferably from about 6.0 mm to about 10 mm. The base of the dovetail key, which meets the rod, may range from about 2.0 mm to about 8.0 mm, preferably from about 3.0 mm to about 5.0 mm. The height of the dovetail key may range from about 5.0 mm to about 15 mm, preferably from about 7.0 mm to about 10.0 mm. The dovetail lock at the widest part may range in width from about 5.0 mm to about 15 mm, preferably from about 7.0 mm to about 10 mm. The dovetail lock at the narrowest part may range from about 2.0 mm to about 8.0 mm, preferably from about 3.0 mm to about 5.0 mm. Distance between the teeth which defines the grooves ranges from about 1.0 mm to about 5.0 mm, preferably from about 2.0 mm to about 3.0 mm. All numerical ranges are inclusive and combinable.

Advantageously, minimal machining is employed in preparing the component parts, i.e., rods and endplates, of the present invention. Shaping the dovetail key and the grooves of the rods as well as the dovetail lock of the endplates involves less time and complexity then machining many single piece silicon carbide semiconductor wafer fixtures. Such single piece silicon carbide wafer fixtures have many complex features. Further, the dovetail key and lock may readily form a stable dovetail joint to secure the component parts of the wafer holding apparatus without the need for additional mechanical components or undesirable chemical sealing agents. Because the rods and endplates of the present invention are monolithic silicon carbide, the rods and endplates are resistant to oxidation, chemical resistant and thermal shock resistant. Also there is no concern for surface peeling from the component parts as with wafer fixtures that are coated with thin films. Such peeling can contaminate both wafer coating processing chambers and semiconductor wafers. Accordingly, the wafer holding apparatus may be employed in any apparatus employed to process wafers, and may be employed in both horizontal and vertical coating methods.

The monolithic silicon carbide components provide sufficient strength and support for the apparatus to prevent sagging due to the weight of semiconductor wafers placed in the grooves. Thus, the apparatus of the present invention may be used to process multiple wafers by horizontal processes without concern for the problems associated with horizontal processing. Additionally the monolithic silicon carbide components enable the apparatus to be placed in vertical apparatus where multiple semiconductor wafers may be processed. Advantageously, the size of the wafer holding apparatus is limited only by the size or height of the semiconductor wafer processing chamber employed.

What is claimed is:

1. A wafer holding apparatus comprising a plurality of rods joined at opposite ends to respective endplates by a dovetail joint, the plurality of rods, the endplates and the dovetail joint are composed of monolithic, CVD silicon carbide, the dovetail joint is secured with a coating of CVD silicon carbide.

2. The apparatus of claim 1, wherein each rod comprises a plurality of alternating teeth and grooves.

3. The apparatus of claim 1, wherein the dovetail joint comprises a dovetail key with a bore at the opposite ends of each rod in combination with a dovetail lock in each endplate, each endplate comprises a bore adjacent the dovetail lock that is in communication with the bore of the dovetail key, and a pin within each bore to join the dovetail key to the dovetail lock.

4. A wafer holding apparatus comprising four rods secured at opposite ends to two respective endplates by a dovetail joint, the dovetail joint comprises a dovetail key at each rod end and a dovetail lock at the respective endplates corresponding to each dovetail key, each rod has a plurality of grooves, the rods, endplates and dovetail joint are composed of monolithic, CVD silicon carbide, the dovetail joint is secured with a coating of CVD silicon carbide.

5. The apparatus of claim 4, wherein an angle of a side of each dovetail key to a surface of each end of each rod is from about 1° to about 45°.

6. The apparatus of claim 4, wherein a face of each dovetail key is at an angle of about 90° to a surface of each end of each rod.

7. The apparatus of claim 4, further comprising a plurality of semiconductor wafers resting in the grooves of the rods.

8. A wafer holding apparatus comprising a plurality of rods secured at opposite ends to two respective endplates by a dovetail joint, the dovetail joint comprises a dovetail key with a plurality of sides at each rod end and a dovetail lock at the respective endplates corresponding to each dovetail key, the apparatus is composed of monolithic CVD silicon carbide, the dovetail joint is secured with a coating of CVD silicon carbide.

9. The wafer holding apparatus of claim 8, wherein each rod of the plurality of rods comprises grooves.

10. The wafer holding apparatus of claim 9, wherein the grooves have a width of about 1.0 mm to about 5.0 mm.

11. The wafer holding apparatus of claim 10, wherein the grooves have a width of about 2.0 mm to about 3.0 mm.

12. The wafer holding apparatus of claim 9, further comprising a plurality of semiconductor wafers resting in the grooves of the plurality of rods.

13. The wafer holding apparatus of claim 8, wherein each endplate comprises blind dovetail locks along a circumference of a face of each endplate.

14. The wafer holding apparatus of claim 8, wherein the dovetail joint further comprises a pin to further secure the dovetail key to the dovetail lock, the pin passes through a hole in a top of the dovetail lock that meets a bore in the dovetail key.

* * * * *